United States Patent
Ohe et al.

(10) Patent No.: US 7,358,599 B2
(45) Date of Patent: Apr. 15, 2008

(54) OPTICAL SEMICONDUCTOR DEVICE HAVING A LEAD FRAME AND ELECTRONIC EQUIPMENT USING SAME

(75) Inventors: Nobuyuki Ohe, Katsuragi (JP); Kazuhito Nagura, Kashihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 168 days.

(21) Appl. No.: 11/063,554

(22) Filed: Feb. 24, 2005

(65) Prior Publication Data

US 2005/0184374 A1 Aug. 25, 2005

(30) Foreign Application Priority Data

Feb. 25, 2004 (JP) .......................... P2004-049469

(51) Int. Cl.
*H01L 29/22* (2006.01)
*H01L 31/09* (2006.01)
*H01L 29/02* (2006.01)
*H01S 5/00* (2006.01)
*H05K 3/30* (2006.01)

(52) U.S. Cl. .............................. 257/678; 257/E33.059; 257/E33.058; 257/E33.073; 257/E33.072; 257/E25.032; 257/E31.117; 257/E31.127; 257/100; 257/98; 257/99; 257/427; 257/601; 264/272.17; 372/108; 385/15; 385/89; 385/92

(58) Field of Classification Search ........ 257/E33.059, 257/E33.058, E33.073, E33.072, E31.117, 257/E31.127, 98–100, 427, 678, 601; 264/272.17; 372/108; 385/15, 89, 92

See application file for complete search history.

(56) References Cited

U.S. PATENT DOCUMENTS

| | | | | |
|---|---|---|---|---|
| 5,506,445 A | * | 4/1996 | Rosenberg | 257/666 |
| 6,184,544 B1 | * | 2/2001 | Toda et al. | 257/98 |
| 6,335,545 B1 | * | 1/2002 | Toda et al. | 257/94 |
| 6,525,386 B1 | * | 2/2003 | Mills et al. | 257/433 |
| 6,731,882 B1 | * | 5/2004 | Althaus et al. | 398/139 |
| 6,781,209 B1 | * | 8/2004 | Althaus et al. | 257/432 |
| 6,917,089 B2 | * | 7/2005 | Schuurmans et al. | 257/427 |
| 7,046,296 B2 | * | 5/2006 | Shinomiya | 348/374 |
| 7,081,644 B2 | * | 7/2006 | Flaherty et al. | 257/98 |

(Continued)

FOREIGN PATENT DOCUMENTS

DE 19935496 C1 * 1/2001

(Continued)

*Primary Examiner*—Alexander Oscar Williams
(74) *Attorney, Agent, or Firm*—Birch Stewart, Kolash & Birch, LLLP

(57) ABSTRACT

An optical semiconductor device 1a includes a lead frame 4 having an aperture 7, a submount 8 disposed on one surface of the lead frame 4 to close the aperture 7, a semiconductor optical element 3 which has an optical portion 6 and which is mounted on a surface of the submount 8 opposite to a surface on a side of the aperture 7 with the optical portion 6 facing the aperture 7 through the submount 8, a molding portion 10 made of a non-transparent molding resin which exposes at least a region including the aperture 7 on the other surface side of the lead frame 4 and which encapsulates the lead frame 4, the semiconductor optical element 3 and the submount 8, and a lens 9 disposed on the other surface of the lead frame 4 to close the aperture 7.

23 Claims, 10 Drawing Sheets

U.S. PATENT DOCUMENTS

| | | | |
|---|---|---|---|
| 2002/0182774 A1* | 12/2002 | Heckman | 438/118 |
| 2003/0161371 A1 | 8/2003 | Althaus et al. | |
| 2004/0188697 A1* | 9/2004 | Brunner et al. | 257/99 |
| 2005/0141584 A1* | 6/2005 | Ohe et al. | 372/108 |
| 2005/0254758 A1* | 11/2005 | Kropp | 385/89 |
| 2006/0018608 A1 | 1/2006 | Mizoguchi | |
| 2006/0118801 A1* | 6/2006 | Hiramoto | 257/98 |
| 2006/0186423 A1* | 8/2006 | Blonder et al. | 257/98 |
| 2007/0080357 A1* | 4/2007 | Ishii | 257/98 |
| 2007/0114547 A1* | 5/2007 | Fujita et al. | 257/98 |

FOREIGN PATENT DOCUMENTS

| | | | |
|---|---|---|---|
| DE | 19947889 A1 * | 5/2001 | |
| DE | 10131698 A1 * | 1/2003 | |
| DE | 10150986 A1 * | 4/2003 | |
| DE | 102 09 063 C1 | 10/2003 | |
| JP | 2000-173947 A | 6/2000 | |

* cited by examiner

OPTICAL SEMICONDUCTOR DEVICE HAVING A LEAD FRAME AND ELECTRONIC EQUIPMENT USING SAME

This nonprovisional application claims priority under 35 U.S.C. §119(a) on Patent Application No. 2004-049469 filed in Japan on Feb. 25, 2004, the entire contents of which are hereby incorporated by reference.

BACKGROUND OF THE INVENTION

The present invention relates to an optical semiconductor device having a semiconductor optical element and to electronic equipment using the same, and more particularly, relates to an optical semiconductor device for use in optical communication links and so forth for sending and receiving optical signals with an optical fiber as a transmission medium, and electronic equipment using the same.

Conventionally, there have been known optical semiconductor devices coupling semiconductor optical elements such as LEDs (Light Emitting Diodes) and PDs (Photo Diodes) to optical fibers, which have been used for optical communications between equipments, at home and in automobiles.

As these optical semiconductor devices, those manufactured utilizing transfer molding of transparent resin as shown in FIG. 15 are widely used. An optical semiconductor device 101 shown in FIG. 15 is structured such that a semiconductor optical element 103 disposed on a lead frame 104 is encapsulated with a transparent resin 110, and the semiconductor optical element 103 is optically coupled to an optical fiber 102 through a lens 108 formed out of part of the transparent resin 110. The semiconductor optical element 103 is electrically connected to the lead frame 104 via wire 105. Further, in some cases, a semiconductor device for driving and controlling the semiconductor optical element 103 is mounted on the lead frame 104. Such optical semiconductor devices utilizing transfer molding have a characteristic of being easily manufactured at low costs compared to, for example, optical semiconductor devices using a glass lens.

It is known that doping resin molding materials with fillers allows adjustment of a coefficient of linear expansion and heat conductivity, and so semiconductor elements which do not need an optical property are encapsulated with molding resins (normally black) added with fillers. Since the above-mentioned optical semiconductor device 101 using the transparent resin 110 put emphasis on the optical property, it was difficult to add the resin with a filler (or the resin is added only with a small amount of the filler), and so the optical semiconductor device 101 had a problem in environmental resistance (including thermal shock resistance and heat dissipation).

Accordingly, as shown in FIG. 16, there has been proposed an optical semiconductor device with a modified structure in which encapsulating is made by a color molding resin added with a filler (see, e.g., JP 2000-173947 A). In an optical semiconductor device 201 shown in FIG. 16, the semiconductor optical element 203 is mounted on a lead frame 204 with only an optical portion 206 thereof being adhered to a glass lens 208, and electrodes around the optical portion 206 of the semiconductor optical element 203 are electrically connected to the lead frame 204 via wire 205. Then, transfer molding is conducted with a color molding resin 209 added with a filler, which makes it possible to encapsulate the semiconductor optical element 203 and the wire 205 with the color molding resin 209 without the color molding resin 209 blocking an optical path through which light comes into and goes out from the semiconductor optical element 203.

As shown in FIG. 16, the optical semiconductor device is structured such that the glass lens 208 is mounted on the optical portion 206 and the semiconductor optical element 203 is encapsulated with the color molding resin 209 with a part of the glass lens 208 included in the color molding resin 209. However, a practical means to perform resin encapsulating with this structure is not disclosed in JP 2000-173947 A. Generally, resin for use in transfer molding has small particles, which induces a phenomenon of resin leaking from a space of several µm. Therefore, it is considered to be difficult to realize such a structure stated in JP 2000-173947 A. Moreover, in the case of using a semiconductor optical element with a relatively large size (several mm to several dozen mm square) such as CCDs (Charge Coupled Devices), it is possible to dispose a glass lens on an optical portion. However, a semiconductor optical element with a small size (several hundred µm square) such as LEDs, which has an extremely small optical portion, needs to use a glass lens that is also extremely small in size, thereby causing problems including: (i) it is difficult to design a lens which can offer optical effects; (ii) it is difficult to manufacture a minute glass lens; and (iii) it is difficult to bond and align the optical portion and the glass lens. Further, if a glass lens that is larger than the optical portion of the semiconductor optical element is used, electrodes close to the optical portion of the semiconductor optical element are also bonded to the glass lens, which makes it impossible to conduct wire bonding.

For the above-stated optical semiconductor device, there has also been disclosed a method with use of a resin lens. However, in the case of using the semiconductor optical element having a small size such as LEDs, its optical portion is small and so there is difficulty in practical application due to the same reasons. Further, in the case of using the resin lens, due to the heat resistance of the lens, it is necessary to perform molding with a color molding resin before the resin lens is mounted, which makes it necessary to hold the optical portion of the semiconductor optical element and a mold by pressure contact or with a minute gap so as to prevent a color resin from coming into the optical portion of the semiconductor optical element. This necessitates damage prevention of the semiconductor optical element and high-accuracy mold management (as well as deformation prevention of a lead frame), bringing about difficulty in manufacturing. Particularly in the case of the semiconductor optical element with a small size such as LEDs, it is extremely difficult to manage so as to prevent the color molding resin from coming into the optical portion while protecting wires.

Also, the transparent molding resin, the semiconductor optical element, the lead frame and the bonding wire are generally different in a coefficient of linear expansion. Consequently, in the range of high operating-temperatures, breaking of the bonding wire, package cracks and so forth occur.

Moreover, heat conductivity of the transparent molding resin is approx. 0.17 W/m·k and is extremely smaller than that of metal (e.g., 365 w/m·k of copper materials), which prevents dissipation of heat generated in the semiconductor optical element and restrains its operation range at high temperature, thereby making it extremely difficult to manufacture optical semiconductor devices with high reliability.

SUMMARY OF THE INVENTION

In consideration of the above situations, an object of the present invention is to provide an optical semiconductor device capable of offering excellent environment resistance and high reliability with a simple structure, achieving reduction in both size and price with high coupling efficiency, and using a semiconductor optical element with a small size such as LEDs and PDs, and electronic equipment using the same.

In order to solve the above problems, the present invention provides an optical semiconductor device comprising:

a lead frame having an aperture;

a submount having transparency which is disposed on one surface of the lead frame to close the aperture of the lead frame;

a semiconductor optical element which has an optical portion and which is mounted on a surface of the submount opposite to a surface on a side of the aperture of the lead frame with the optical portion facing the aperture through the submount;

a molding portion made of a non-transparent molding resin which exposes at least a region including the aperture on the other surface side of the lead frame and which encapsulates the lead frame, the semiconductor optical element and the submount; and a lens disposed on the other surface of the lead frame to close the aperture of the lead frame.

The optical portion of the semiconductor optical element herein refers to, for example, a portion to emit light of the semiconductor optical element, or a portion to receive light of the semiconductor optical element, and if the semiconductor optical element is an LED for example, the optical portion refers to a light emitting face, while if the semiconductor optical element is a PD, the optical portion refers to a light receiving face.

According to the optical semiconductor device of the present invention, the lead frame, the semiconductor optical element and the submount are encapsulated with the molding portion made of a non-transparent molding resin in the state that at least a region including the aperture on the other surface side of the lead frame is exposed. If the semiconductor optical element is, for example, a light-receiving device, then incident light through the lens and the aperture of the lead frame passes through the submount having transparency and becomes incident to the optical portion (light-receiving face) of the semiconductor optical element mounted on the surface of the submount opposite to the surface of the aperture-side of the lead frame. On the other hand, if the semiconductor optical element is a light-emitting device, then outgoing light from the optical portion (emitting face) of the semiconductor optical element passes through the submount having transparency and goes out through the aperture of the lead frame and the lens. Therefore, with a simple structure, it becomes possible to reliably encapsulate the semiconductor optical element, the submount and the wire (for electrically connecting the semiconductor optical element and the lead frame) with the non-transparent molding resin, thereby allowing increase in operating range at high temperature and realizing the optical semiconductor device with excellent environment resistance and high reliability. Further, it becomes possible to satisfy reduction in both size and price with high coupling efficiency, and to use the semiconductor optical element with a small size such as LEDs and PDs.

Further, there is provided a lens disposed on the other surface of the lead frame to close the aperture of the lead frame, and the lens can be made larger than the aperture of the lead frame, which makes it possible to increase optical coupling efficiency between the semiconductor optical element and the optical fiber. In addition, in the manufacturing process of the optical semiconductor device, the lens can be mounted after the lead frame and the like are encapsulated by the molding portion, which allows manufacturing of the optical semiconductor device without causing damages on the lens and thereby improves quality. In the case where the lens is made of resin in particular, it brings about more advantage, because the lens has low heat resistance. It is to be noted that the lens is a separate entity from the molding portion and has transparency.

In one embodiment, the non-transparent molding resin includes a 70 wt % or more filler.

According to the embodiment, using a non-transparent molding resin containing a 70 wt % or more filler makes it possible to decrease difference in a coefficient of linear expansion among the semiconductor optical element, the lead frame and the bonding wire, which allows manufacturing of the optical semiconductor device with high reliability free from breaking of the bonding wire or package cracks.

In one embodiment, the submount is provided with an electrode which is electrically connected to a front-surface electrode of the semiconductor optical element.

According to the embodiment, bonding the electrode to the semiconductor optical element concurrently with mounting of the semiconductor optical element on the submount allows easy electric connection between the semiconductor optical element and the submount, which makes it possible to achieve downsizing of the optical semiconductor device and space saving thereby.

In one embodiment, the electrode mounted on the submount has at least one notch, and a space between the submount and the optical portion of the semiconductor optical element is filled with a transparent resin.

According to the embodiment, an air layer is not present between the semiconductor optical element and the submount, which allows realization of the optical semiconductor device with high coupling efficiency. Also, when filling the transparent resin into a clearance between the submount and the optical portion of the semiconductor optical element, the transparent resin is introduced with use of the notch provided on the electrode of the submount, which allows easy filling of the transparent resin.

In one embodiment, the molding portion has a hole portion that exposes the aperture, and the hole portion in the molding portion is shaped to become narrower from its opening toward the aperture side of the lead frame.

According to the embodiment, the hole portion in the molding portion facilitates and ensures alignment of the semiconductor device and an optical fiber, so that communication with high communication quality is achieved. Moreover, it is not necessary to separately provide an alignment means, which makes it possible to achieve downsizing. Further, alignment of the optical fiber becomes more secure, and the hole portion is shaped to become narrower from its opening toward the lead frame side to collect light, so that in the case where the semiconductor optical element is, for example, a light-receiving device, induction of incident light is facilitated, and light-receiving efficiency is improved.

In one embodiment, the lens is made of a transparent resin.

In one embodiment, the non-transparent molding resin contains a filler, and the lens is attached at least to the molding portion out of the molding portion and the lead frame with an adhesive made of a resin having the same level of coefficient of linear expansion as that of the non-transparent molding resin.

According to the embodiment, although the molding portion of the non-transparent molding resin is largely different in a coefficient of linear expansion from the lens made of the transparent resin, use of an adhesive made of a resin having the same level of coefficient of linear expansion as that of the non-transparent molding resin makes it possible to absorb stress generated by difference in a coefficient of linear expansion between the molding portion and the lens, thereby allowing wider range of operating temperature to be realized.

In one embodiment, the lens has a mounting portion in a region outside an optical path, and the molding portion has a recess portion for mounting of the lens, the recess portion corresponding to the mounting portion of the lens.

According to the embodiment, the mounting portion of the lens is attached to the recess portion of the molding portion, so that the lens can be mounted on the molding portion outside the optical path, which prevents reduction of coupling efficiency between the semiconductor optical element and the optical fiber.

In one embodiment, the mounting portion of the lens has an adhesive reservoir portion for containing the adhesive.

According to the embodiment, the adhesive can be contained in the adhesive reservoir portion, and the lens can be reliably mounted at least on the molding portion. Further, when the adhesive is applied on the molding portion and the lead frame for mounting of the lens, an excessive amount of the adhesive is led to the adhesive reservoir portion and spread therein, thereby allowing the adhesive to be reliably filled in the adhesive reservoir portion.

Further, in one embodiment, the adhesive reservoir portion is placed on the surface of the mounting portion on the side of the lead frame.

In one embodiment, the lens has a protruding portion which is fitted into the aperture of the lead frame.

According to the embodiment, the protruding portion of the lens is fitted into the aperture of the lead frame, so that the lens can be reliably aligned with the lead frame.

In one embodiment, the lens is made of a transparent resin, the non-transparent molding resin includes a filler, and the lens is mounted on the molding portion and the lead frame with an adhesive made of a resin having the same level of coefficient of linear expansion as that of the non-transparent molding resin.

According to the embodiment, although the molding portion of the non-transparent molding resin is largely different in a coefficient of linear expansion from the lens made of the transparent resin, use of an adhesive made of resin having a coefficient of linear comparable with that of the non-transparent molding resin makes it possible to absorb stress generated by difference in a coefficient of linear expansion between the molding portion and the lens, thereby allowing wider range of operating temperature to be realized.

In one embodiment, the adhesive has transparency and is filled in the aperture of the lead frame.

According to the embodiment, the protruding portion of the lens can be reliably attached to the aperture of the lead frame, which allows more solid mounting of the lens on the lead frame. Moreover, since the adhesive is filled in the aperture of the lead frame, air layers do not exist among the optical portion of the semiconductor optical element, the submount and the lens, which allows enhancement of coupling efficiency.

In one embodiment, the lens has an adhesive reservoir portion for containing the adhesive around the protruding portion.

According to the embodiment, an excessive amount of the adhesive filled in the hole portions of the lead frame is led to the adhesive reservoir portion and spread therein, thereby allowing the adhesive to be reliably filled in the adhesive reservoir portion and allowing reliable mounting of the lens on the lead frame.

In one embodiment, the lead frame has at least two alignment hole portions, and the lens has protrusions which are fitted into the hole portions of the lead frame.

According to the embodiment, the protrusions of the lens are fitted into the hole portions of the lead frame, so that the lens can be reliably aligned with the lead frame.

In one embodiment, the hole portions of the lead frame are provided in a vicinity of the aperture of the lead frame and in a region closed by the submount.

According to the embodiment, during manufacturing process of the semiconductor device, the hole portions as well as the aperture are closed by the submount, which makes it possible to prevent the hole portions to be filled with the molding portion, thereby allowing reliable mounting of the lens on the lead frame.

In one embodiment, the lens is made of a transparent resin, the non-transparent molding resin includes a filler, and the lens is mounted on the molding portion and the lead frame with an adhesive made of a resin having the same level of coefficient of linear expansion as that of the non-transparent molding resin.

According to the embodiment, although the molding portion of the non-transparent molding resin is largely different in a coefficient of linear expansion from the lens made of the transparent resin, use of an adhesive made of resin having a coefficient of linear comparable with that of the non-transparent molding resin makes it possible to absorb stress generated by difference in a coefficient of linear expansion between the molding portion and the lens, thereby allowing wider range of operating temperature to be realized.

In one embodiment, the adhesive has transparency and is filled in the aperture and the hole portions of the lead frame.

According to the embodiment, the protrusions of the lens can be reliably attached to the hole portions of the lead frame, which allows more solid mounting of the lens on the lead frame. Moreover, since the adhesive is filled in the aperture of the lead frame, air layers do not exist among the optical portion of the semiconductor optical element, the submount and the lens, which allows enhancement of coupling efficiency.

In one embodiment, the lens has an adhesive reservoir portion for containing the adhesive around the protrusions.

According to the embodiment, an excessive amount of the adhesive filled in the hole portions of the lead frame is led to the adhesive reservoir portion and spread therein, thereby allowing the adhesive to be reliably filled in the adhesive reservoir portion and allowing reliable mounting of the lens on the lead frame.

One embodiment further comprises a signal processing integrated circuit which is disposed on the lead frame and is electrically connected to the semiconductor optical element.

According to the embodiment, the semiconductor optical element and the signal processing integrated circuit can be manufactured as a single package, thereby allowing implementation of downsizing and space saving.

In one embodiment, the semiconductor optical element is a light-receiving device, and the signal processing integrated circuit is an amplifying integrated circuit for amplifying an output signal from the light-receiving device, and the light-receiving device and the amplifying integrated circuit are included in a single chip.

According to the embodiment, wire between the light-receiving device and the amplifying integrated circuit is not necessary, so that a stray capacitance is reduced and fast response is obtainable. Moreover, since the number of chips is decreased, manufacturing is facilitated and cost reduction can be achieved.

In one embodiment, the semiconductor optical element includes a light-emitting device and a light-receiving device, and the signal processing integrated circuit includes a driving integrated circuit for driving the light-emitting device and an amplifying integrated circuit for amplifying an output signal from the light-receiving device.

According to the embodiment, covering the light-emitting device and the light-receiving device separately with the non-transparent molding resin makes it possible to remove an influence of stray light noise to achieve communication with high communication quality with a simple structure and to achieve downsizing.

In one embodiment, the driving integrated circuit and the amplifying integrated circuit are included in a single chip.

According to the embodiment, the number of chips is decreased, which facilitates manufacturing and allows cost reduction.

In one embodiment, the signal processing integrated circuit includes at least one of an output external connection terminal for outputting information regarding operational states and an input external connection terminal for receiving control information.

According to the embodiment, the output signal from the output external communication terminal and the input signal from the input external communication terminal make it possible to control operation of the signal processing circuit, thereby allowing sophisticated communication with high communication quality.

Electronic equipment of the present invention includes the optical semiconductor device.

According to the electronic equipment, using the optical semiconductor device makes it possible to improve reliability as well as to achieve downsizing and cost reduction.

As is clear from the above description, according to the optical semiconductor device of the present invention, even in the case where a small-size semiconductor optical element as PDs and LEDs is used, it is possible with a simple structure to encapsulate the semiconductor optical element and the wire with the non-transparent molding resin excellent in environment resistance, which makes it possible to provide a small-size optical semiconductor device with excellent environment resistance and high reliability at a low cost. Further, there is provided the lens disposed on the other surface of the lead frame to close the aperture of the lead frame, and the lens can be made larger than the aperture of the lead frame, which makes it possible to increase optical coupling efficiency between the semiconductor optical element and the optical fiber.

Further, since the light-receiving device and the amplifying integrated circuit are formed in a single chip, wire between the light-receiving device and the amplifying integrated circuit is not necessary, so that a stray capacitance is reduced and fast response is obtainable. Moreover, since the number of chips is decreased, manufacturing is facilitated and cost reduction can be achieved.

Further, the light-emitting device, the light-receiving device, the driving integrated circuit for the light-emitting device, the amplifying integrated circuit for the light-receiving device are formed in a single package and encapsulated with the non-transparent molding resin, so that an influence of stray light noise can be eliminated without a complicated mechanism, which allows communication with high communication quality and makes it possible to achieve downsizing.

Further, the optical semiconductor device incorporates at least one of the output external connection terminal and the input external connection terminal for receiving and supplying information regarding operational states and control information from and to the driving integrated circuit for the light-emitting device and the amplifying integrated circuit for the light-receiving device, which allows sophisticated communication with high communication quality.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE PREFERRED EMBODIMENTS

Hereinbelow, the present invention will be described in detail in conjunction with the embodiments with reference to the accompanying drawings.

First Embodiment

Figure 1:
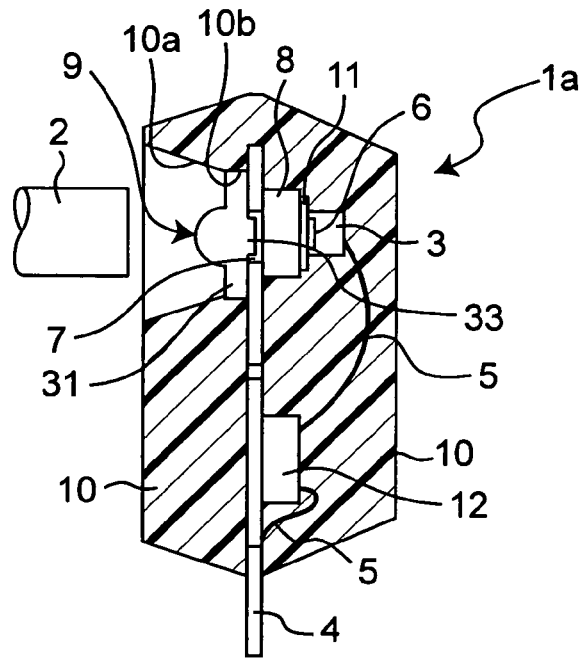
FIG. 1 is a schematic sectional view showing an outlined structure of an optical semiconductor device according to a first embodiment of the present invention.
Figure 2:
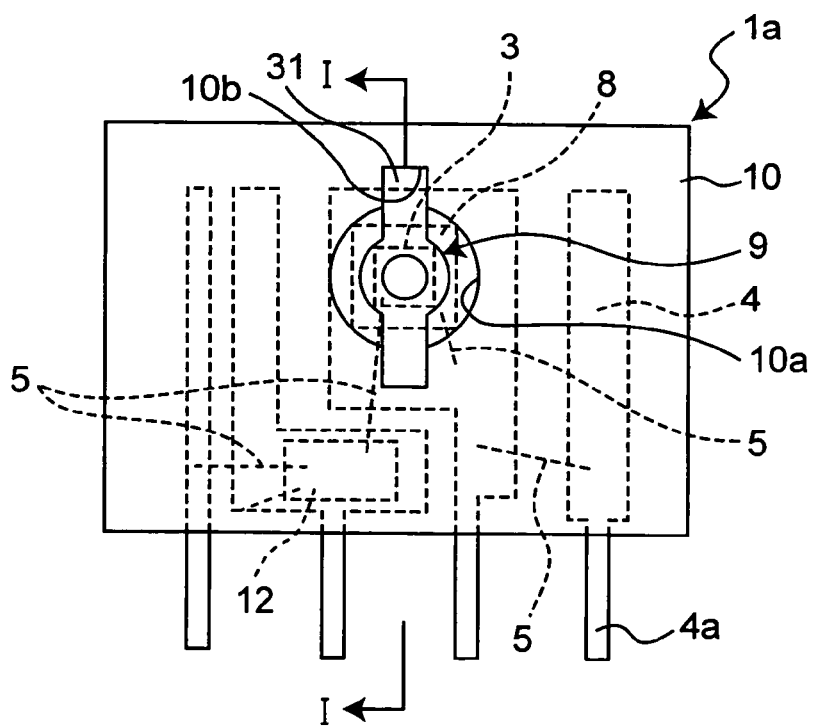
FIG. 2 is a front view showing an outlined structure of the optical semiconductor device according to the first embodiment of the present invention.

FIG. 1 is a schematic sectional view showing an outlined structure of an optical semiconductor device according to a first embodiment of the present invention, and FIG. 2 is a front view showing the optical semiconductor device viewed from the side of an optical fiber 2. FIG. 1 shows a section taken along a line I-I of FIG. 2.

As shown in FIGS. 1 and 2, the optical semiconductor device 1a is composed of a lead frame 4 having an aperture 7, a glass submount 8 exemplifying a submount having transparency disposed on one surface of the lead frame 4 so as to close the aperture 7 of the lead frame 4, a semiconductor optical element 3 which has an optical portion 6 and which is mounted on a surface of the submount 8 opposite to the surface on the side of the aperture 7 of the lead frame 4 with the optical portion 6 facing the aperture 7 through the submount 8, a signal processing circuit (semiconductor element) 12 exemplifying signal processing integrated circuit disposed on the one surface of the lead frame 4, a molding portion 10 made of non-transparent molding resin which exposes at least a region including the aperture 7 on the other surface side of the lead frame 4 and which encapsulates the lead frame 4, the semiconductor optical element 3, the submount 8 and the signal processing circuit 12, and an (optical) lens 9 disposed on the other surface of the lead frame 4 to close the aperture 7 of the lead frame 4. The optical portion 6 herein refers to a portion for emitting light of the semiconductor optical element 3 or a portion for receiving light, which represents, for example, a light-emitting face in LEDs and a light-receiving face in PDs.

The semiconductor optical element 3 is bonded to the glass submount 8 in the state of having electric conduction thereto with the optical portion 6 facing the lead frame 4 in the direction opposite to the normal disposition direction (face-down layout). The glass submount 8 is equipped with electrodes (unshown) so as to be electrically connected to electrodes (unshown) of the semiconductor optical element 3. The electric bonding between the electrodes of the glass submount 8 and the electrodes of the semiconductor optical element 3 is established through gold-tin eutectic bonding, use of an Ag paste, use of an Au bump and so forth. Both the electrodes of the glass submount 8 and the semiconductor optical element 3 are provided so as not to block an optical path of the optical portion 6.

When the glass submount 8 is electrically bonded to the semiconductor optical element 3, an air layer is generated between the glass submount 8 and the optical portion 6 of the semiconductor optical element 3. With generation of such an air layer, efficiency to extract light from the light-emitting device (transmission efficiency) is degraded if the semiconductor optical element 3 is a light-emitting device, while coupling efficiency of the light-receiving device (reception efficiency) is degraded if the semiconductor optical element 3 is a light-receiving device. Thus, the optical semiconductor device in the first embodiment is structured such that clearance between the glass submount 8 and the semiconductor optical element 3 is filled with a transparent resin portion 11 so as to prevent generation of an air layer and to prevent degradation of the transmission efficiency and the reception efficiency. As the transparent resin, silicon, epoxy resin and so forth are used.

The lens 9 provided in the aperture 7 of the lead frame 4, which is provided for increasing transmission efficiency in the light-emitting device and reception efficiency in the element, is molded with transparent resin.

Figure 3A:
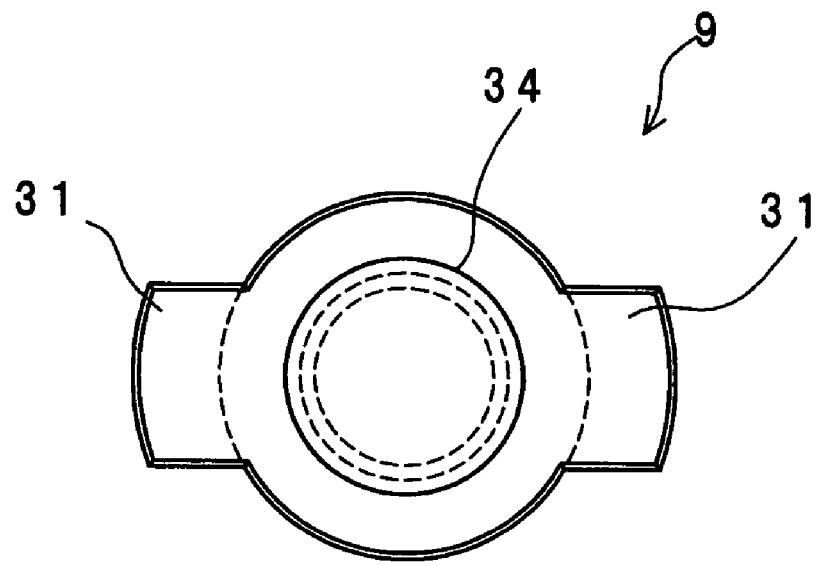
FIG. 3A is a plane view of a lens.
Figure 3B:
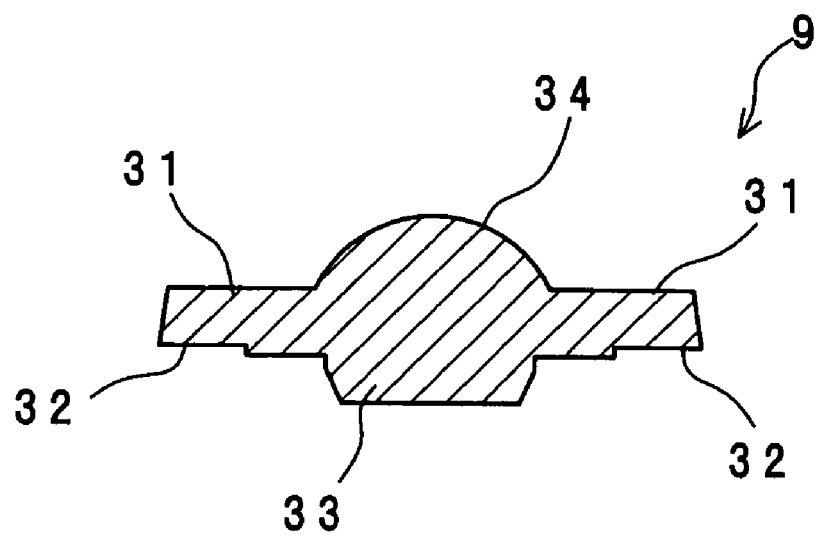
FIG. 3B is a sectional view of the lens.

FIG. 3A is a plane view of the optical lens 9, and FIG. 3B is a sectional side view of the optical lens 9. As shown in FIG. 3A and FIG. 3B, the lens 9 has a lens portion 34 provided on an optical path and a mounting portion 31 provided in an outer circumference portion of the lens portion 34, i.e., a region outside of the optical path. Further, the lens 9 has a protruding portion 33 for alignment which is provided on the surface opposite to the lens portion 34 and which is shaped so as to be inserted into the aperture 7 of the lead frame 4. Moreover, the lens 9 is fixed on the lead frame 4 and the molding portion 10 with a transparent resin adhesive, and the mounting portion 31 of the lens 9 has an adhesive reservoir portion 32 for containing the adhesive.

As the transparent resins constituting the lens 9 and the adhesive, polycarbonate, acrylic and olefin resins or the other resins are used, and it is desirable to use resins with high light transmittance or with high index of refraction As shown in FIG. 2, the molding portion 10 has a recess portion 10b for mounting of the lens, the recess portion 10b corresponding to the mounting portion 31 of the lens 9.

The lens 9 is fixed and bonded to the molding portion 10 and the lead frame 4 with an adhesive made of a transparent resin having the same level of coefficient of linear expansion as that of the non-transparent molding resin doped with fillers used in the molding portion 10. In this case, an excessive amount of the adhesive is led to the adhesive reservoir portion 32 and spread therein so that the adhesive reservoir portion 32 is reliably filled.

Then, a rear-surface electrode of the semiconductor optical element 3 and the signal processing circuit 12 are electrically connected through wire 5, the glass submount 8 and the lead frame 4 are electrically connected through wire 5, the signal processing circuit 12 and the lead frame 4 are electrically connected through wire 5, and the lead frames 4 are electrically connected to each other through wire 5.

Figure 4A:
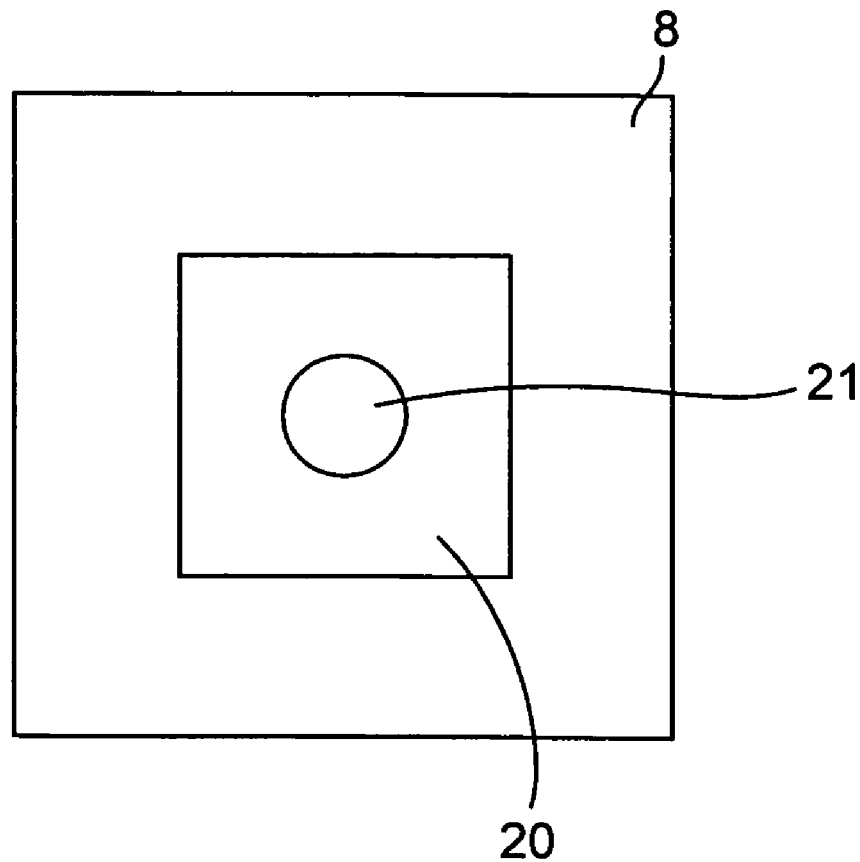
FIG. 4A is a bottom view of a submount.
Figure 4B:
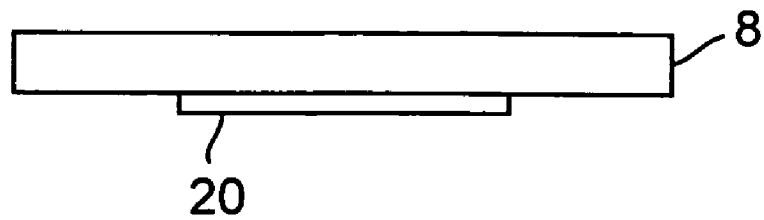
FIG. 4B is a side view of the submount.

FIG. 4A is a view of the submount as viewed from the electrode side, and FIG. 4B is a side view of the submount. As shown in FIG. 4A and FIG. 4B, on one face of the submount 8, there is provided an electrode 20 which is electrically connected to a surface electrode (unshown) of the semiconductor optical element 3. The electrode 20 has an almost round-shaped optical path hole 21 formed so as not to close the optical portion 6 (i.e., the light-emitting portion and light-receiving portion) of the semiconductor optical element 3.

The electric connection between the electrode 20 of the submount 8 and the surface electrode of the semiconductor optical element 3 is established through gold-tin eutectic bonding, use of an Ag paste, an Au bump and so forth. The optical path hole 21 is filled with transparent resin for preventing deterioration in transmission efficiency or reception efficiency of the semiconductor optical element 3.

In the case of the submount 8 in FIGS. 4A and 4B, for establishing electric bonding between the front-surface electrode of the semiconductor optical element 3 and the electrode 20 of the submount 8, first, the optical path hole 21 is filled with a transparent resin, the front-surface electrode of the semiconductor optical element 3 and the electrode 20 of the submount 8 are electrically connected, and a space between the semiconductor optical element 3 and the submount 8 is filled with a transparent resin.

Figure 5A:
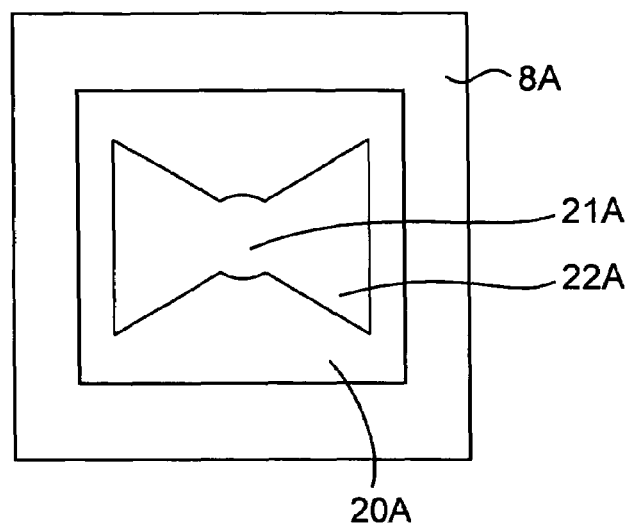
FIG. 5A is a bottom view of another submount.
Figure 5B:
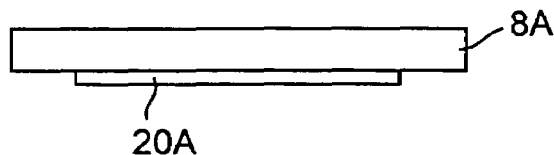
FIG. 5B is a side view of the submount.
Figure 5C:
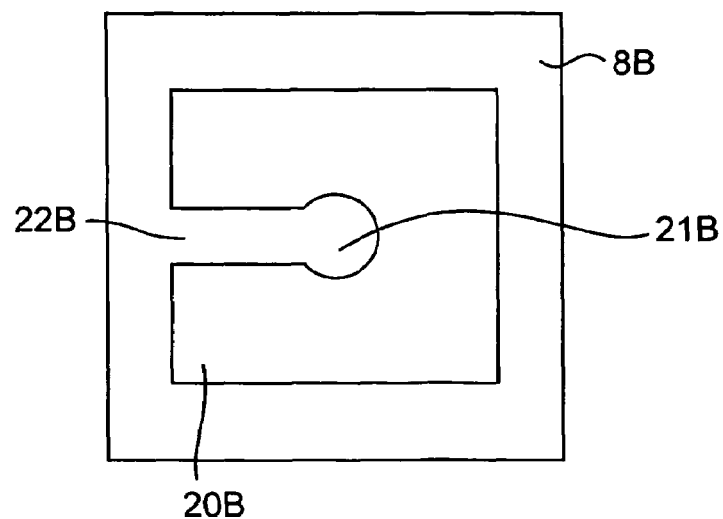
FIG. 5C is a bottom view of another submount.

Moreover, FIG. 5A is a bottom view showing a submount 8A with a hole and a notch filled with transparent resin, viewed from the electrode side, FIG. 5B is side view showing the submount 8A, and FIG. 5C is a bottom view showing a submount 8B with an electrode 20B different in shape from that of FIG. 5A, viewed from the electrode side.

In FIGS. 5A and 5B, on one surface of the glass submount 8A, there is provided an electrode 20A which is electrically connected to a front-surface electrode (unshown) of the semiconductor optical element 3, and the electrode 20A is provided with an optical path hole 21A not to block an optical portion 6 (i.e., a light-emitting portion and a light-receiving portion) of the semiconductor optical element 3, and almost triangular-shaped notches 22A that respectively expand in left-hand direction and light-hand direction.

The electric connection between the electrode 20A of the submount 8A and the surface electrode of the semiconductor optical element 3 is established through gold-tin eutectic bonding, use of an Ag paste, an Au bump and so forth. The optical path hole 21A is filled with transparent resin for preventing deterioration in transmission efficiency or reception efficiency of the semiconductor optical element 3.

In the case of the submount 8A in FIGS. 5A and 5B, first, the front-surface electrode of the semiconductor optical element 3 and the electrode 20A of the submount 8A are electrically connected, and then a transparent resin is filled from the hole 21A or a notch 22A provided on the electrode 20A, so that a space between the semiconductor optical element 3 and the submount 8A is filled with the transparent resin. In this case, an excessive amount portion of the transparent resin filled in the optical path hole 21A is guided and spreads to the notch 22A side, which ensures filling of the transparent resin.

In an example of FIG. 5C, the submount 8B is provided with the electrode 20B having an optical path hole 21B and a rectangular-shaped notch 22B. The optical path hole 21B and the rectangular-shaped notch 22B have the same functions as those of FIG. 5A.

Further, as shown in FIGS. 1 and 2, the semiconductor optical element 3, the wire 5 and the signal processing circuit 12 are covered with a molding portion 10 made of a non-transparent molding resin which includes a 70 wt % or more filler so as to have a coefficient of linear expansion not so different from that of the wire 5, and to have high heat conductivity and excellent environment resistance. Moreover, the lead frame 4 is covered with the molding portion 10 except lead terminals 4a. Also a surface (front surface) of the lead frame 4 opposite to one surface on which the semiconductor optical element 3 is disposed is enclosed with the molding portion 10 except a portion of the aperture 7. The semiconductor optical element 3 is optically coupled with the optical fiber 2 through the transparent resin portion 11, the glass submount 8, the lens 9 and the aperture 7 of the lead frame 4.

Description is now given of a manufacturing method of the optical semiconductor device 1a in the first embodiment.

First, an electrode formed on the optical portion 6-side surface of the semiconductor optical element 3 and an electrode formed on the glass submount 8 are electrically connected. The electric connection between the electrode of the glass submount 8 and the electrode of the semiconductor optical element 3 is established by a method involving conductivity such as gold-tin eutectic bonding, soldering, use of an Ag paste, an Au bump and so forth. In this stage, a space between the semiconductor optical element 3 and the glass submount 8 is filled with a transparent resin.

Next, the glass submount 8 is bonded to the lead frame 4 in such a way that the optical portion 6 of the semiconductor optical element 3 which is electrically connected to the glass submount 8 faces the aperture 7 of the lead frame 4. The bonding of the glass submount 8 and the lead frame 4 is achieved with an adhesive, an Ag paste and so forth. In this case, it is desirable to use an adhesive having high heat conductance in consideration of heat dissipation of the semiconductor optical element 3.

Next, the signal processing circuit 12 is bonded to the lead frame 4 with an adhesive such as Ag pastes. It is desirable to use an adhesive having high heat conductance in consideration of heat dissipation of the semiconductor optical element 3.

Next, a rear-surface electrode of the semiconductor optical element 3, the electrode provided on the glass submount 8 and the signal processing circuit 12 are electrically connected to the lead frame 4 through wire 5.

Next, there is conducted transfer molding of the molding portion 10 made of a non-transparent molding resin including a 70 wt % or more filler. The molding portion 10 made of a non-transparent molding resin has a coefficient of linear expansion not so different from that of the wire 5, and has high heat conductivity and excellent environment resistance. Herein, a mold is pressed to periphery of the aperture 7 to close the aperture 7 from the front surface-side of the lead frame 4 so as to prevent the molding portion 10 made of a molding resin from coming into the aperture 7 from the front surface side of the lead frame 4.

Further, at the same time, the mold is pressed to the recess portion (step) 10b for aligning and fixing the lens 9 so as to prevent the molding portion 10 made of a molding resin from coming into the front surface side of the lead frame 4.

The lens 9 separately molded with a transparent resin is fixed and bonded to the molding portion 10 with an adhesive made of a transparent resin having the same level of coefficient of linear expansion as that of the non-transparent molding resin including fillers used in the molding portion 10.

As shown in FIG. 1, an alignment guide portion 10a for the optical fiber 2 that exemplifies a hole portion is provided on the molding portion 10 in the vicinity of the aperture 7 on the front surface side of the lead frame 4, by which an optical fiber 2 can be accurately positioned. The alignment guide portion 10a is a conical surface. The hole portion 10a is shaped to become narrower from its opening toward the side of the aperture 7 of the lead frame 4.

It is to be noted that the adhesive may be filled in the aperture 7 of the lead frame 4 (i.e., between the aperture 7 of the lead frame 4 and the protruding portion 33 of the lens 9). Moreover, the lens 9 may be mounted only on the lead frame 4 with the adhesive.

Second Embodiment

Figure 6:
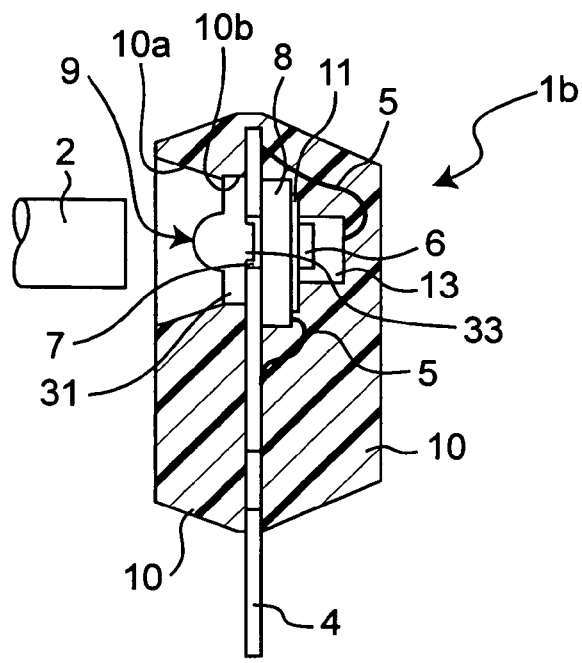
FIG. 6 is a schematic sectional view showing an outlined structure of an optical semiconductor device according to a second embodiment of the present invention.
Figure 7:
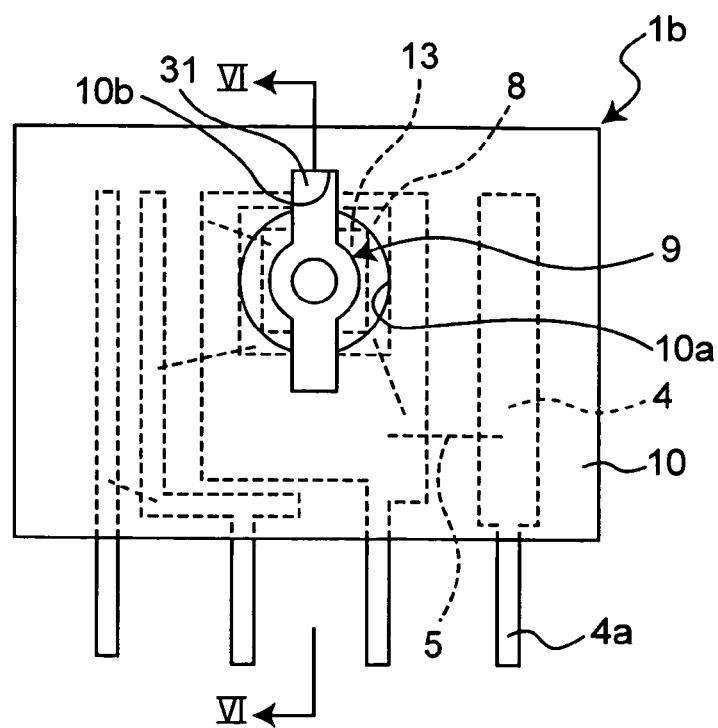
FIG. 7 is a front view showing an outlined structure of the optical semiconductor device according to the second embodiment of the present invention.

FIG. 6 is a schematic sectional view showing an outlined structure of an optical semiconductor device according to a second embodiment of the present invention, and FIG. 7 is a front view showing the optical semiconductor device viewed from the side of an optical fiber 2. FIG. 6 shows a section taken along the line VI-VI of FIG. 7.

The optical semiconductor device 1b in the second embodiment is different from the optical semiconductor device 1a in the first embodiment of FIGS. 1 and 2 in the point that an IC (Integrated Circuit) 13 is mounted on a glass submount 8, wherein the IC 13 is a single chip incorporating a light-receiving device in the case where the semiconductor optical element is the light-receiving device and an amplifying integrated circuit that is the signal processing circuit 12 in FIGS. 1 and 2 showing the first embodiment.

The IC 13 formed as a single chip is mounted at the same position as that of the semiconductor optical element 3 in the first embodiment. Other aspects of the optical semiconductor device including a mounting method and a structure are the same as the first embodiment. Since the optical semiconductor device has the same structure as the optical semiconductor device in the first embodiment, like component members are designated by like reference numerals to omit explanation thereof.

In this second embodiment, the IC 13 and the wire 5 can be encapsulated with the molding portion 10 made of a non-transparent molding resin including a filler and excellent in environment resistance with a simple structure, thereby making it possible to provide an optical semiconductor device 1b with excellent environment resistance at a low cost.

Further, since the light-receiving device and the amplifying integrated circuit are formed into a single chip as the IC 13, the optical semiconductor device 1b does not need wire between the light-receiving device and the amplifying integrated circuit, so that a stray capacitance is reduced and fast response is obtainable, while at the same time the optical semiconductor device 1b becomes less susceptible to an influence of electromagnetic noise. Moreover, since the number of chips is decreased, manufacturing is facilitated and cost reduction can be achieved.

Third Embodiment

Figure 8:
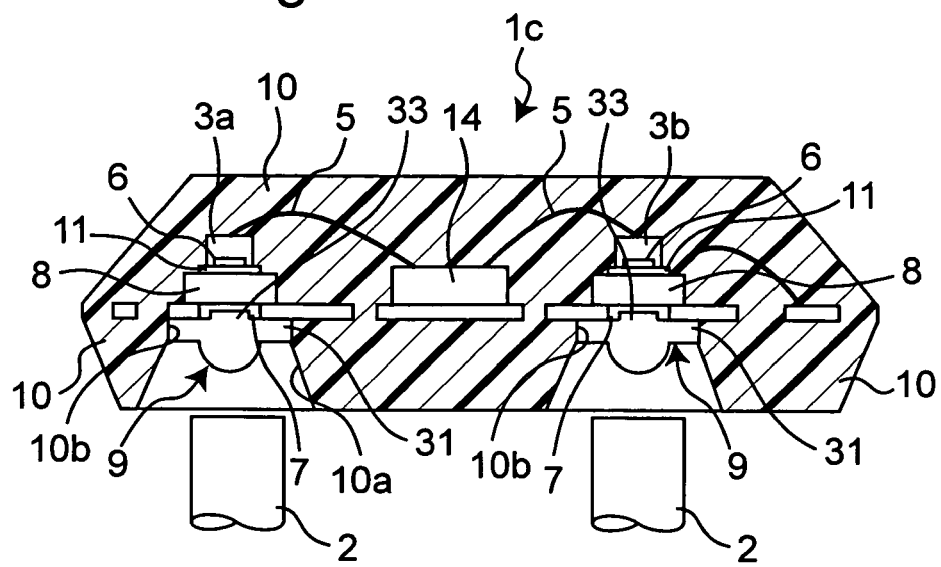
FIG. 8 is a schematic sectional view showing an outlined structure of an optical semiconductor device according to a third embodiment of the present invention.
Figure 9:
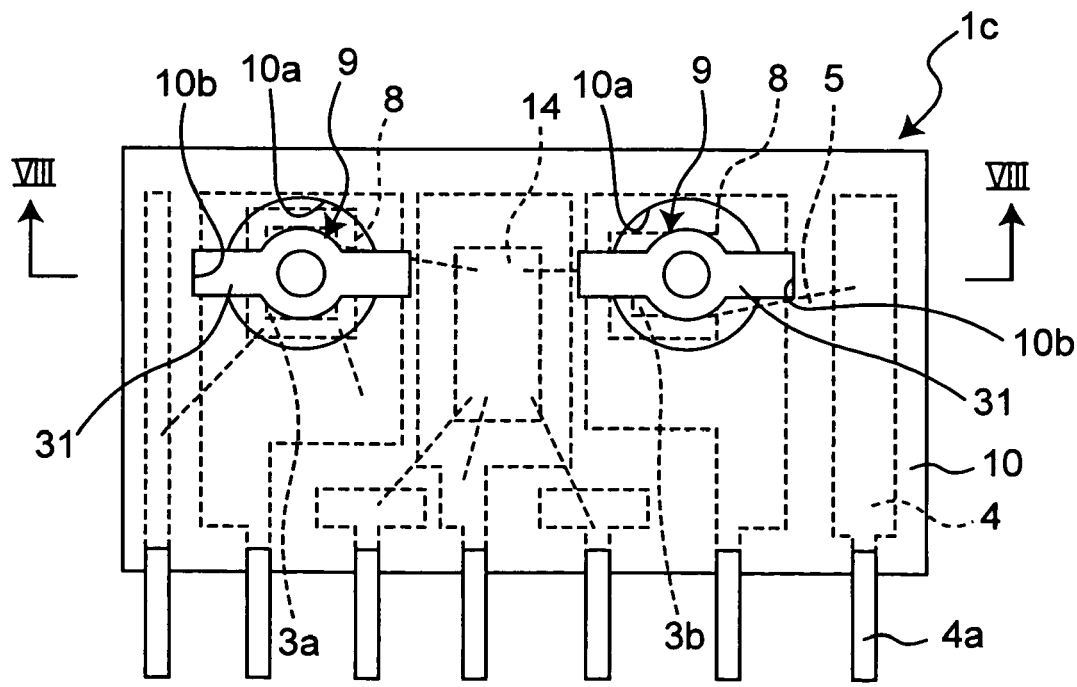
FIG. 9 is a front view showing an outlined structure of the optical semiconductor device according to the third embodiment of the present invention.

FIG. 8 is a schematic sectional view showing an outlined structure of an optical semiconductor device according to a third embodiment of the present invention, and FIG. 9 is a front view of the optical semiconductor device viewed from the side of optical fibers 2. FIG. 8 shows a section taken along the line VIII-VIII of FIG. 9.

The optical semiconductor device 1c in the third embodiment is different from the optical semiconductor device 1a of the first embodiment of FIGS. 1 and 2 in the point that a light-emitting device 3b, a light-receiving device 3a, and an IC 14 composed of a driving integrated circuit for the light-emitting device 3b and an amplifying integrated circuit for the light-receiving device 3a are incorporated in a single package. Other aspects are the same as the first embodiment.

In the optical semiconductor device 1c of the third embodiment, the light-emitting device 3b, the light-receiving device 3a and the IC 14 are incorporated in a single package, which makes it possible to structure a transmitter-receiver with the single package.

Generally, in the case where a transmitter-receiver has a configuration of a single package, due to light reflection inside the package, transmission light from a light-emitting device is coupled to a light-receiving device to make a noise (stray light noise) component, which sometimes causes malfunction and degradation of communication quality. In order to prevent the stray light noise, a light shielding plate and the like need to be mounted, which makes manufacturing difficult and increases a manufacturing cost.

To the contrary, the optical semiconductor device 1c of the third embodiment uses the molding portion 10 made of a non-transparent molding resin, so that there is no light reflection inside the package and therefore the transmission light from the light-emitting device 3b is not coupled to the light-receiving device 3a. Consequently, the stray light noise is not generated, and so an influence of stray light noise can be eliminated without a complicated mechanism, which allows communication with high communication quality and makes it possible to achieve downsizing.

In FIGS. 8 and 9, the driving integrated circuit for the light-emitting device and the amplifying integrated circuit for the light-receiving device which serve as signal processing circuits are formed in a single chip. However, the circuits may respectively have configurations of separate chips. Moreover, like the second embodiment, the light-receiving device and the amplifying integrated circuit for the light-receiving device may be structured as a single chip and the driving integrated circuit for the light-emitting device may be provided separately.

As is clear from the above description, according to the optical semiconductor device 1c of the third embodiment, even in the case of where the small-sized semiconductor optical elements 3a and 3b such as PDs and LEDs are used to structure a transmitter-receiver, it is possible with a simple structure to encapsulate the semiconductor optical elements 3a, 3b and the wire 5 with the molding portion 10 which is made of a non-transparent molding resin including a filler and excellent in environment resistance, which makes it possible to provide the optical semiconductor device 1c with excellent environment resistance at a low cost.

Fourth Embodiment

A fourth embodiment of the present invention is characterized in that the driving integrated circuit for the light-emitting device and the amplifying integrated circuit for the light-receiving device in the third embodiment includes an output external connection terminal and an input external connection terminal for supplying and receiving information regarding the operational states and control information. Other aspects are the same as the third embodiment.

Figure 10:
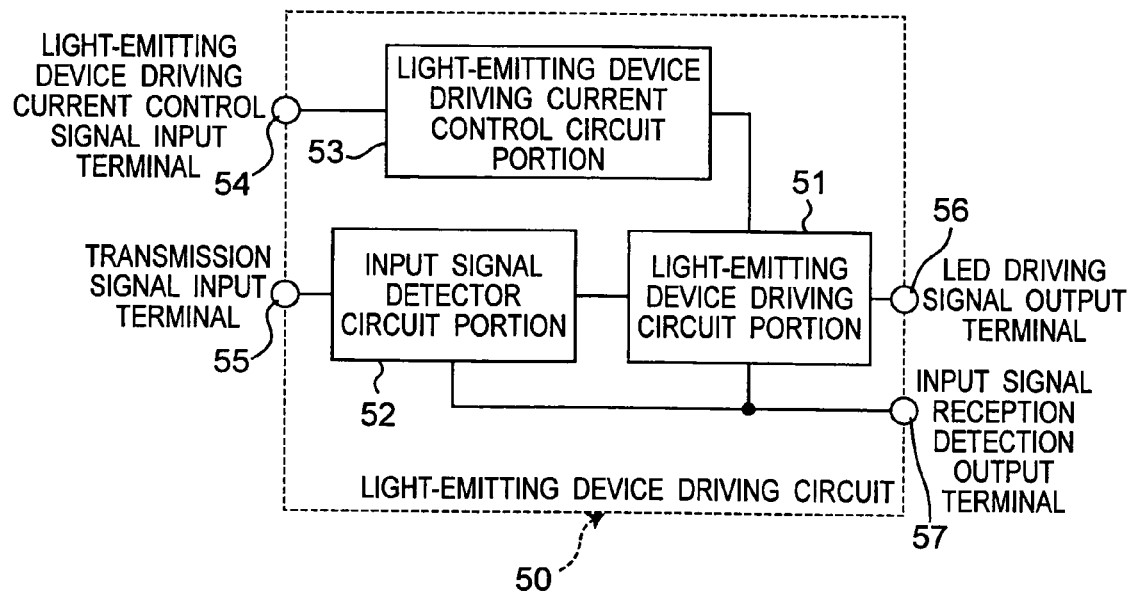
FIG. 10 is an explanatory view showing an outlined structure of a light-emitting device driving circuit in an optical semiconductor device according to a forth embodiment of the present invention.

FIG. 10 shows a structure of a light-emitting device driving circuit 50 that exemplifies a driving integrated circuit for a light-emitting device in the optical semiconductor device in the fourth embodiment. The light-emitting device driving circuit 50 is composed of a light-emitting device driving circuit portion 51, an input signal detector circuit portion 52, and a light-emitting device driving current control circuit portion 53, all of which are formed in a single chip. The input signal detector circuit portion 52 has a function to detect the input of a transmission signal and to output a signal representing it. Based on the signal from the input signal detector circuit portion 52, the light-emitting device driving circuit portion 51 is put in a standby state when there is no input signal, and the light-emitting device driving circuit portion 51 is put in an operational state upon detection of an input signal. In FIG. 10, there are shown a light-emitting device driving current control signal input terminal 54, a transmission signal input terminal 55, an LED driving signal output terminal 56, and an input signal reception detection output terminal 57. The light-emitting device driving current control signal input terminal 54 and the transmission signal input terminal 55 are examples of input external connection terminals, while the LED driving signal output terminal 56 and the input signal reception detection output terminal 57 are examples of output external connection terminals.

With such a structure, it becomes possible to reduce power consumption during the standby state. Moreover, by providing the input signal reception detection output terminal 57 to the outside, it also becomes possible to reduce power consumption during the standby state in other peripheral circuits in a similar manner.

Moreover, the light-emitting device driving current control circuit portion 53 controls the light-emitting device driving circuit portion 51 on the basis of light-emitting device driving current control signal from the outside to control driving current of the light-emitting device. For instance, an LED serving as a light-emitting device has a characteristic that its optical output drops at a high temperature. With use of the light-emitting device driving current control circuit portion 53 of the fourth embodiment, it becomes possible to increase driving current at a high temperature, increase optical output, and reduce optical drop at a high temperature, which makes it possible to achieve communication with high communication quality.

Moreover, LEDs serving as light-emitting devices have dispersion in optical outputs, and further, due to mounting variations during manufacturing process, optical outputs from transmitters exhibit dispersion. In the fourth embodiment, it is possible to control an optical output from the LED with the driving current based on light-emitting device driving current control signals from the outside, so that the optical output from a transmitter can be monitored and matched with a specified optical output, thereby achieving communication with high communication quality.

Figure 11:
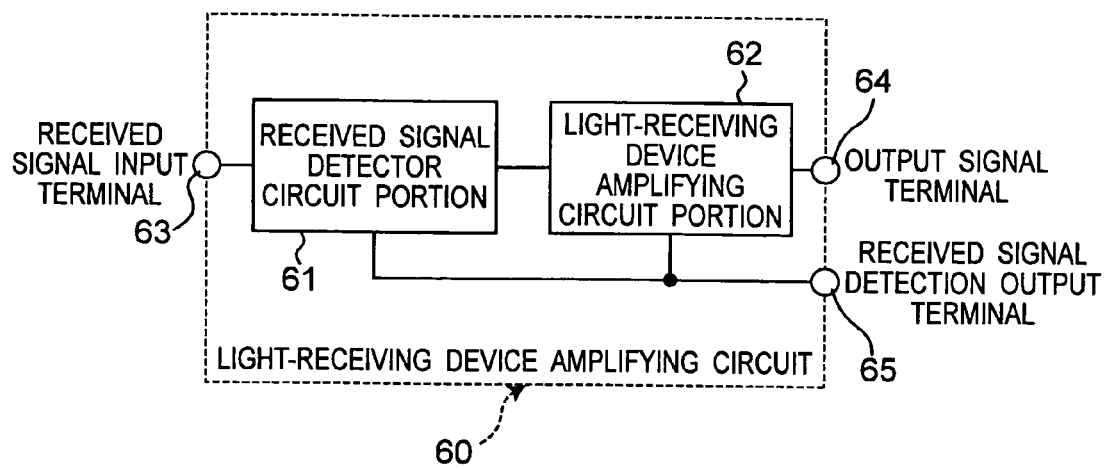
FIG. 11 is an explanatory view showing an outlined structure of a light-receiving device amplifying circuit in an optical semiconductor device according to a forth embodiment of the present invention.

Further, FIG. 11 shows a structure of a light-receiving device amplifying circuit 60 that exemplifies an amplifying integrated circuit for the light-receiving device in the fourth embodiment. The light-receiving device amplifying circuit 60 is composed of a received signal detector circuit portion 61 and a light-receiving device amplifying circuit portion 62, both of which are formed in a single chip. The received signal detector circuit portion 61 has a function to detect input of received signals and to output detection signals. In FIG. 11, there are shown a received signal input terminal 63, an output signal terminal 64, and a received signal detection output terminal 65. The terminal 63 is an example of an input external connection terminal, while the output signal terminal 64 and the received signal detection output terminal 65 are examples of output external connection terminals.

Based on a detection signal from the received signal detector circuit portion 61, the light-receiving device amplifying circuit portion 62 is put in a standby state when there is no received signal, and the light-receiving device amplifying circuit portion 62 is put in an operational state upon detection of a received signal. With such a structure, it becomes possible to reduce power consumption during the standby state. Moreover, by providing the received signal detection output signal terminal 65, it also becomes possible to reduce power consumption during the standby state in other peripheral circuits in a similar manner.

As described above, in the optical semiconductor device including the light-emitting device driving circuit 50 and the light-receiving device amplifying circuit 60 stated in the fourth embodiment, the light-emitting device driving circuit 50 and the light-receiving device amplifying circuit 60 incorporate the output external connection terminals and the input external connection terminals for receiving and supplying information regarding the operational states and control information, so that the operation of signal processing circuit can be controlled with detection signals and input signals from the outside, thereby achieving a sophisticated communication with high communication quality.

In the optical semiconductor device in the fourth embodiment, the light-emitting device driving circuit 50 is composed of the light-emitting device driving circuit portion 51, the input signal detector circuit portion 52, and the light-emitting device driving current control circuit portion 53 for detecting the presence and absence of transmission signal input and for controlling light-emitting device driving current with light-emitting device driving current control signals from the outside. In addition to the above, integrating the light-emitting device driving circuit 50 with light-receiving device amplifying circuit 60 allows the light-emitting device driving circuit 50 to control itself only with internal communication without the aid of external control signals or the like, that is, for instance, the light-emitting device driving circuit 50 can control the light-emitting device driving current based on a control signal from the light-receiving device amplifying circuit 60.

Further, although the light-emitting device driving circuit 50 is constituted by the light-emitting device driving circuit portion 51, the input signal detector circuit portion 52 and the light-emitting device driving current control circuit portion 53, a logic circuit for controlling the light-emitting device driving circuit 50 may also be incorporated.

Further, although the light-receiving device amplifying circuit 60 is constituted by the received signal detector circuit portion 61 and the light-receiving device amplifying circuit portion 62, a logic circuit for controlling the light-receiving device amplifying circuit 60 may also be incorporated.

Fifth Embodiment

Figure 12:
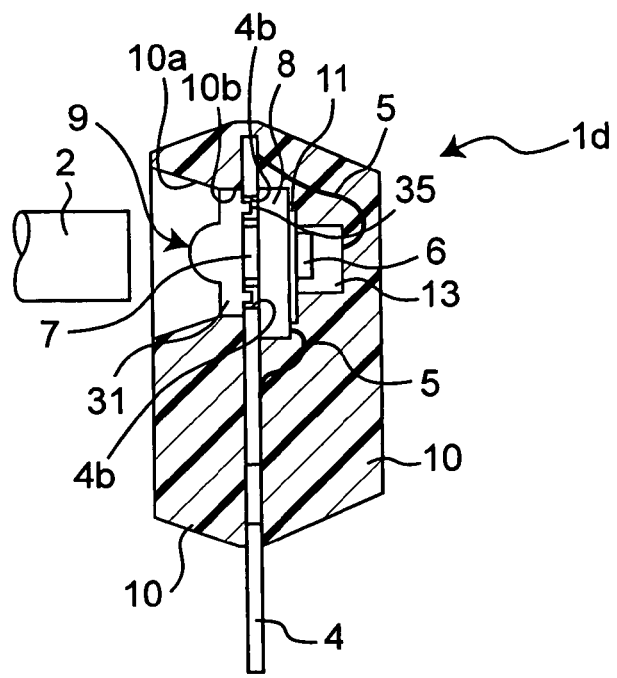
FIG. 12 is a schematic sectional view showing an outlined structure of an optical semiconductor device according to a fifth embodiment of the present invention.
Figure 13:
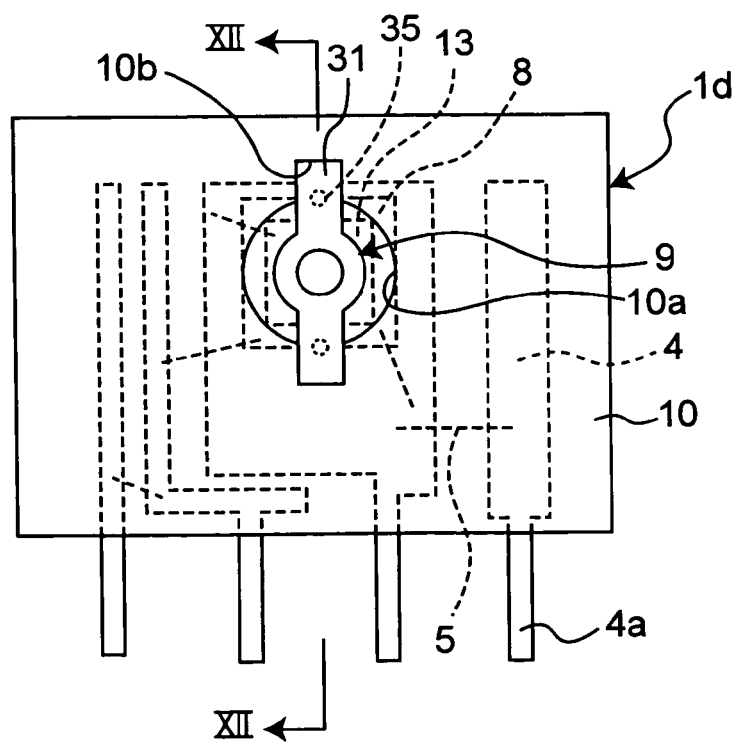
FIG. 13 is a front view showing an outlined structure of the optical semiconductor device according to the fifth embodiment of the present invention.
Figure 14A:
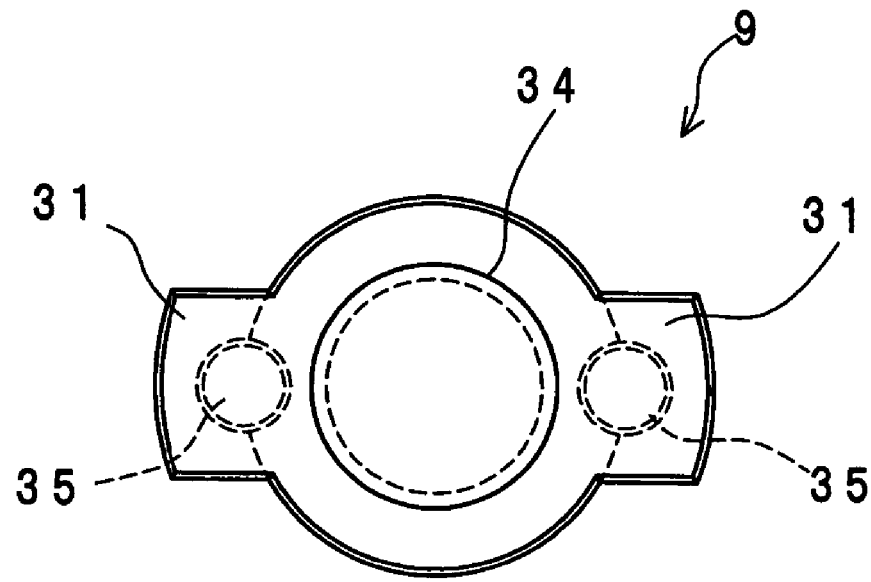
FIG. 14A is a plane view of a lens.
Figure 14B:
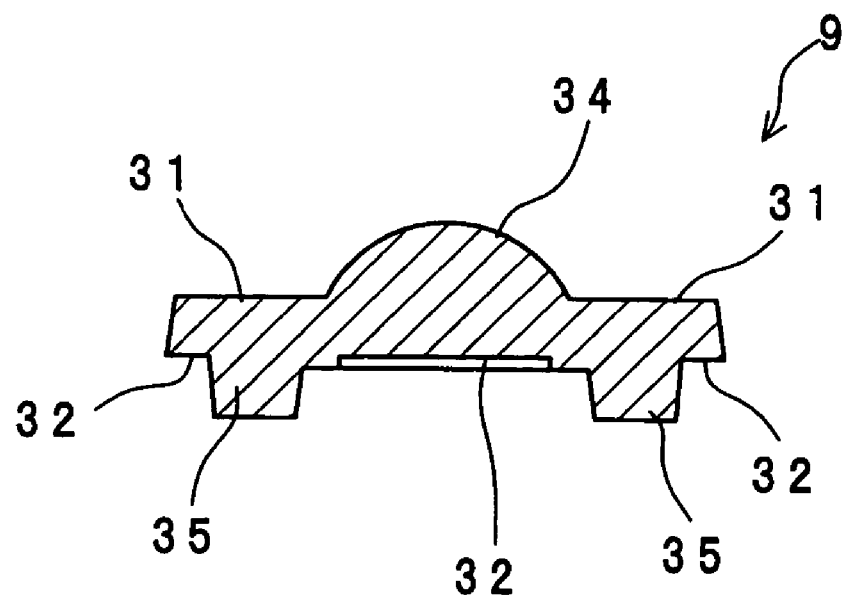
FIG. 14B is a sectional view of the lens.
Figure 15:
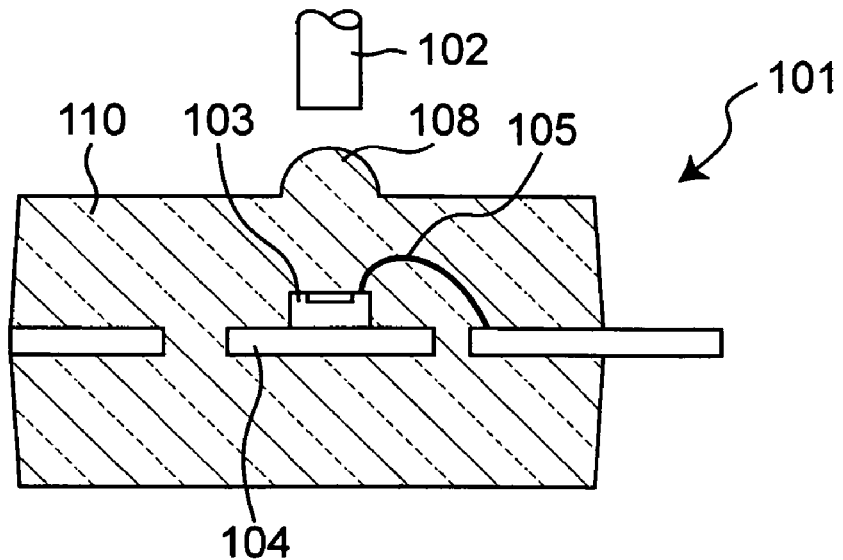
FIG. 15 is a sectional view showing an outlined structure of a conventional optical semiconductor device.
Figure 16:
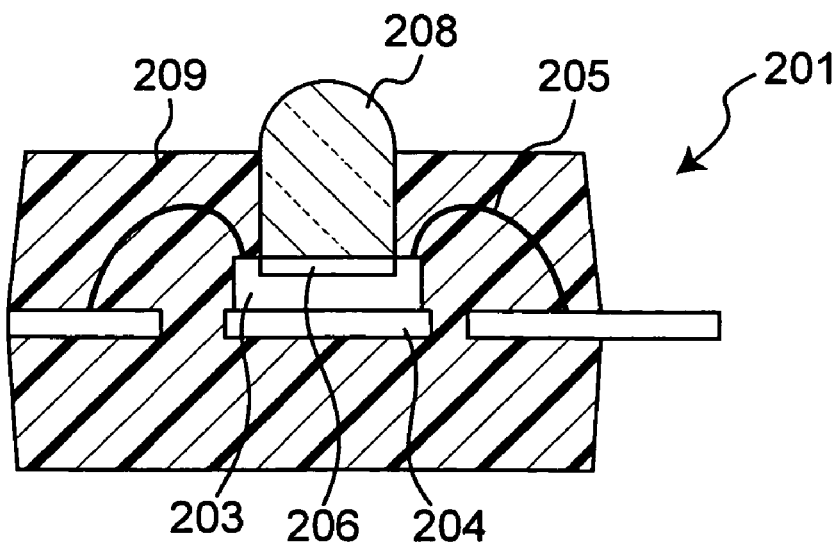
FIG. 16 is a sectional view showing an outlined structure of another conventional optical semiconductor device.

FIG. 12 to FIG. 14 are explanatory views showing outlined structure of an optical semiconductor device in a fifth embodiment of the present invention. FIG. 12 is a schematic sectional view showing an outlined structure of the optical semiconductor device, and FIG. 13 is a front view of the optical semiconductor device as viewed from the side of an optical fiber 2. FIG. 12 shows a section taken along the line XII-XII of FIG. 13. FIG. 14A is a plane view of a lens, and FIG. 14B is a sectional side view of the lens.

Description is given of a point different from the first embodiment. The lens 9 has protrusions 35 on a surface of a mounting portion 31 opposite to a lens portion 34, and the lead frame 4 has hole portions 4b shaped in response to the protrusions 35 of the lens 9. By fitting the protrusions 35 of the lens 9 into the hole portions 4b of the lead frame 4, the lens 9 is mounted on the lead frame 4. Thus, reliably alignment of the lens 9 with the lead frame 4 can be achieved. Other structures are similar to those in the first embodiment.

More specifically, as shown in FIG. 14A and FIG. 14B, the lens 9 is structured to provide the mounting portion 31 in an outer circumference portion of the lens portion 34 provided on an optical path, i.e., a region outside the optical path. Further, the protrusions 35 for alignment and fixation are provided on the surface of the mounting portion 31 opposite to the lens portion 34.

The lens 9 is molded with a transparent resin and is fixed to the lead frame 4 and the molding portion 10 with a transparent adhesive. Further, on the surface of the lens 9 on the side of the lead frame 4, there is provided a adhesive reservoir portion 32 for containing the transparent adhesive.

As shown in FIG. 12 and FIG. 13, the molding portion 10 has a recess portion (step) 10b which is shaped so as to allow the mounting portion 31 of the lens 9 to be inserted therein for alignment and fixation, while the lead frame 4 has the hole portions 4b which is shaped so as to allow the protrusions 35 of the lens 9 to be inserted for alignment and fixation, and the lens 9 is further fixed with a transparent adhesive. In order to implement reliable bonding, an excessive amount of the adhesive is led to the adhesive reservoir portion 32 and spread therein so that the adhesive reservoir portion 32 is reliably filled therewith.

The hole portions 4b of the lead frame 4 are provided in the vicinity of the aperture 7 of the lead frame 4 and within a region closed by the submount 8. During the manufacturing process of the optical semiconductor device, the hole portions 4b are closed together with the aperture 7 by the submount 8, which makes it possible to prevent the hole portions 4b to be filled with the molding portion 10.

As the transparent resin of the lens 9, polycarbonate, acrylic and olefin resins or the other resins are used, and it is desirable to use resins with high light transmittance or with high index of refraction. As the adhesive, it is desirable to use a transparent resin having the same level of coefficient of linear expansion as that of the non-transparent molding resin including fillers used in the molding portion 10.

It is to be noted that the adhesive may be filled in the aperture 7 of the lead frame 4 and in the hole portions 4b (i.e., between the aperture 7 of the lead frame 4 and the protruding portion 33 of the lens 9, and between the hole portion 4b of the lead frame 4 and the protrusion 35 of the lens 9).

The optical semiconductor device of the present invention is used in electronic equipment such as digital TV (televisions) sets, digital BS (Broadcasting Satellite) tuners, CS (Communication Satellite) tuners, DVD (Digital Versatile Disc) players, super audio CD (Compact Disc) players, AV (Audio Visual) amplifiers, audios, personal computers, personal computer peripherals, cellular phones and PDAs (Personal Digital Assistants). The optical semiconductor device of the present invention is also used in electronic equipment in the environment with a wide operating temperature range, for instance, in-car equipment such as car audios, automotive navigation systems and sensors, as well as factory robot sensors and control equipment.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical semiconductor device comprising:
a lead frame having an aperture;
a submount having transparency which is disposed on one surface of the lead frame to close the aperture of the lead frame;
a semiconductor optical element which has an optical portion and which is mounted on a surface of the submount opposite to a surface on a side of the a aperture of the lead frame with the optical portion facing the aperture through the submount;
a molding portion made of a non-transparent molding resin which exposes at least a region including the aperture on the other surface side of the lead frame and which encapsulates the lead frame, the semiconductor optical element and the submount; and
a lens attached to the other surface of the lead frame to close the aperture of the lead frame, wherein
the non-transparent molding resin includes a 70 wt % or more filler.

2. The optical semiconductor device as defined in claim 1, wherein
the submount is provided with an electrode which is electrically connected to a front-surface electrode of the semiconductor optical element.

3. The optical semiconductor device as defined in claim 1, wherein
the electrode mounted on the submount has at least one notch, and
a space between the submount and the optical portion of the semiconductor optical element is filled with a transparent resin.

4. An optical semiconductor device comprising:
a lead frame having an aperture;
a submount having transparency which is disposed on one surface of the lead frame to close the aperture of the lead frame;
a semiconductor optical element which has an optical portion and which is mounted on a surface of the submount opposite to a surface on a side of the aperture of the lead frame with the optical portion facing the aperture through the submount;
a molding portion made of a non-transparent molding resin which exposes at least a region including the aperture on the other surface side of the lead frame and which encapsulates the lead frame, the semiconductor optical element and the submount; and
a lens attached to the other surface of the lead frame to close the aperture of the lead frame, wherein
the molding portion has a hole portion that exposes the aperture, and
the hole portion in the molding portion has a partial cone shape with an opening that is larger than the aperture side at the lead frame.

5. The optical semiconductor device as defined in claim 4, wherein
the lens is made of a transparent resin.

6. The optical semiconductor device as defined in claim 5, wherein
the non-transparent molding resin contains a filler, and
the lens is attached at least to the molding portion out of the molding portion and the lead frame with an adhesive made of a resin having the same level of coefficient of linear expansion as that of the non-transparent molding resin.

7. The optical semiconductor device as defined in claim 6, wherein
the lens has a mounting portion in a region outside an optical path, and
the molding portion has a recess portion for mounting of the lens, the recess portion corresponding to the mounting portion of the lens.

8. The optical semiconductor device as defined in claim 7, wherein
the mounting portion of the lens has an adhesive reservoir portion for containing the adhesive.

9. The optical semiconductor device as defined in claim 4, wherein the lens has a protruding portion which is fitted into the aperture of the lead frame.

10. The optical semiconductor device as defined in claim 9, wherein
the lens is made of a transparent resin,
the non-transparent molding resin includes a filler, and
the lens is mounted on the molding portion and the lead frame with an adhesive made of a resin having the same level of coefficient of linear expansion as that of the non-transparent molding resin.

11. The optical semiconductor device as defined in claim 10, wherein
the adhesive has transparency and is filled in the aperture of the lead frame.

12. The optical semiconductor device as defined in claim 11, wherein
the lens has an adhesive reservoir portion for containing the adhesive around the protruding portion.

13. The optical semiconductor device as defined in claim 1, wherein
the lead frame has at least two alignment hole portions, and
the lens has protrusions which are fitted into the hole portions of the lead frame.

14. The optical semiconductor device as defined in claim 13, wherein
the hole portions of the lead frame are provided in a vicinity of the aperture of the lead frame and in a region closed by the submount.

15. The optical semiconductor device as defined in claim 13, wherein
the lens is made of a transparent resin,
the non-transparent molding resin includes a filler, and
the lens is mounted on the molding portion and the lead frame with an adhesive made of a resin having the same level of coefficient of linear expansion as that of the non-transparent molding resin.

16. The optical semiconductor device as defined in claim 15, wherein
the adhesive has transparency and is filled in the aperture and the hole portions of the lead frame.

17. The optical semiconductor device as defined in claim 16, wherein
the lens has an adhesive reservoir portion for containing the adhesive around the protrusions.

18. The optical semiconductor device as defined in claim 4, further comprising
a signal processing integrated circuit which is disposed on the lead frame and is electrically connected to the semiconductor optical element.

19. The optical semiconductor device as defined in claim 18, wherein
the semiconductor optical element is a light-receiving device, and the signal processing integrated circuit is an amplifying integrated circuit for amplifying an output signal from the light-receiving device, and
the light-receiving device and the amplifying integrated circuit are included in a single chip.

20. The optical semiconductor device as defined in claim 18, wherein
the semiconductor optical element includes a light-emitting device and a light-receiving device, and
the signal processing integrated circuit includes a driving integrated circuit for driving the light-emitting device and an amplifying integrated circuit for amplifying an output signal from the light-receiving device.

21. The optical semiconductor device as defined in claim 20, wherein
the driving integrated circuit and the amplifying integrated circuit are included in a single chip.

22. The optical semiconductor device as defined in claim 18, wherein
the signal processing integrated circuit includes at least one of an output external connection terminal for outputting information regarding operational states and an input external connection terminal for receiving control information.

23. Electronic equipment including the optical semiconductor device as defined in claim 1.

* * * * *